United States Patent [19]
Mignardi et al.

[11] Patent Number: 5,597,767
[45] Date of Patent: Jan. 28, 1997

[54] SEPARATION OF WAFER INTO DIE WITH WAFER-LEVEL PROCESSING

[75] Inventors: Michael A. Mignardi, Dallas; Laurinda Ng, Plano; Ronald S. Croff, Allen; Robert McKenna, Houston; Lawrence D. Dyer, Richardson, all of Tex.

[73] Assignee: Texas Instruments Incorporated, Dallas, Tex.

[21] Appl. No.: 369,838

[22] Filed: Jan. 6, 1995

[51] Int. Cl.⁶ .................................... H01L 21/302
[52] U.S. Cl. .................. 437/227; 437/226; 437/229; 148/DIG. 12; 148/DIG. 28
[58] Field of Search ...................... 437/226, 227, 437/229, 8; 148/DIG. 12, DIG. 28

[56] References Cited

U.S. PATENT DOCUMENTS

| | | | |
|---|---|---|---|
| 4,808,549 | 2/1989 | Mikkor et al. | 437/226 |
| 5,162,251 | 11/1992 | Poole et al. | 437/220 |
| 5,217,916 | 6/1993 | Anderson et al. | 437/226 |
| 5,219,796 | 6/1993 | Quinn et al. | 437/226 |
| 5,279,975 | 1/1994 | Devereaux et al. | 437/227 |
| 5,331,454 | 7/1994 | Hornbeck | 359/224 |
| 5,358,590 | 10/1994 | Yamanaka | 437/226 |
| 5,393,706 | 2/1995 | Mignardi et al. | 437/226 |
| 5,418,190 | 5/1995 | Cholewa et al. | 437/227 |
| 5,435,876 | 7/1995 | Alfaro et al. | 156/247 |
| 5,445,559 | 8/1995 | Gale et al. | 451/388 |

*Primary Examiner*—Kevin M. Picardat
*Attorney, Agent, or Firm*—Robert C. Klinger; James C. Kesterson; Richard L. Donaldson

[57] ABSTRACT

A method of separating wafers, such as those used for semiconductor device manufacture, into die. A partly fabricated wafer is covered with a protective coating over its top surface (10). The wafer is then inscribed to define separation lines between die, with the separation lines being of a predetermined depth (12). The protective coating is then removed (14), and at least one processing step is performed at the wafer level (15, 22–24), before the inscribed wafer is separated into die. Then, the wafer is separated into die along the separation lines (17).

20 Claims, 1 Drawing Sheet

SEPARATION OF WAFER INTO DIE WITH WAFER-LEVEL PROCESSING

TECHNICAL FIELD OF THE INVENTION

This invention relates to manufacturing die from wafers, such as those used for integrated circuits, and more particularly to a two-step die separation process that permits intervening wafer-level processing.

BACKGROUND OF THE INVENTION

Semiconductor manufacturing techniques are cost effective because many die can be mass produced from a single wafer. First, the wafer is processed to create the various components of each die. Then, the wafer is separated into individual die, which each are packaged into the final integrated circuit.

Depending on the nature of the die, problems can arise during the separation of the wafer into die. Many conventional separation methods involve some sort of sawing, which is a "wet" process likely to cause damage to liquid-sensitive elements. Also, the separation can result in contamination of the die by debris resulting from the separation process. Some die are more susceptible to these types of damage than others, especially die having micromechanical elements that must have freedom of motion.

In the case of micromechanical devices, the wafer manufacturing process often includes formation of a "sacrificial layer" between other layers of the wafer. For these devices, one approach to eliminating damage during die separation is to retain the sacrificial layer while the wafer is being sawn into die. However, this requires the sacrificial layer to be removed from each die as a separate piece, instead of being removed at the wafer level. This die-level processing is time consuming and expensive. Also, steps that must follow removal of the sacrificial layer, such as passivation and testing, are more efficiently done at the wafer level.

U.S. patent application Ser. No. 08/001378, entitled "Integrated Partial Sawing Process", describes a technique for partially sawing a wafer before breaking it. The method includes covering the "streets" created by the partial sawing with a protective material.

SUMMARY OF THE INVENTION

One aspect of the invention is a method of separating a wafer into die. Typically, the method is performed on a wafer that is substantially fabricated. The top surface of the wafer is covered with a protective coating. Separation lines are inscribed on the top surface of the wafer. The separation lines represent boundaries between die and have a predetermined depth. During the inscription step, the protective coating protects the top surface of the wafer, but the protective coating is removed immediately after the inscription. Next, the wafer is processed with at least one wafer-level process. This processing step depends on the type of die being made, but a typical example of this processing step is removal of a sacrificial layer of die being made into micromechanical devices. If needed, the die can be functionally tested at this time. Finally, the wafer is separated into die along the separation lines.

An advantage of the invention is that it permits "back end" processing and testing to be performed at the wafer level rather than die-by-die. Yet, it avoids the risk of damage to the die that would otherwise occur if die separation were delayed until after these wafer-level steps are performed. In the case of micro-mechanical devices and similar devices that use a sacrificial layer between wafer layers, the invention permits all wet processing to be performed before the sacrificial layer is removed.

DETAILED DESCRIPTION OF THE INVENTION

Figure 1:
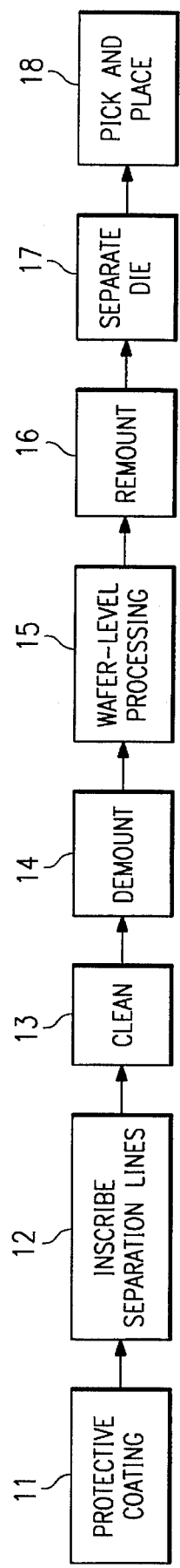
FIG. 1 illustrates a method of separating a wafer into die in accordance with the invention.

The following description is in terms of manufacturing a digital micro-mirror device (DMD). A typical DMD device is comprised of an array of mirror elements, each having a tiny tilting mirror. Each mirror is suspended by one or more hinges over a substrate of addressing circuitry. For a typical DMD, the manufacturing process begins with fabricating the addressing circuitry. A sacrificial layer is deposited in what will later be air gaps between the addressing circuitry and the mirrors of each die. The support posts for the hinges are formed. Then, the metal for the hinges and mirrors is deposited on the top surface of the sacrificial layer and etched to define the hinges and mirrors.

As explained below, the invention involves a two-step wafer separation process, with intervening wafer-level processing. In the case of a DMD, an inscribing step is performed before the sacrificial layer is removed. During this inscribing step, the sacrificial layer supports the delicate mirror elements and prevents debris from accumulating under them. Then, the sacrificial layer is removed while the wafer is in this inscribed condition but is still intact as a wafer. Finally, the wafer is separated into die along the separation lines. Other intervening wafer-level processing may be performed, such as testing.

Further details of DMD structure and manufacture, without the two-part separation and other steps of the present invention, are set out in a number of patents and patent applications. An exemplary patent application, which describes many techniques common to fabrication of various types of DMDs, is U.S. patent application Ser. No. 08/171, 303, entitled "Improved Multi-Level Digital Micromirror Device", assigned to Texas Instruments Incorporated, and incorporated by reference herein.

The invention is not limited to manufacture of DMDs, and is useful for the manufacture of any device made from die that are processed at the wafer level. The invention is especially useful for manufacturing devices that have at least one processing step whose performance increases risk of damage by subsequent sawing, but that is most efficiently performed at the wafer level. Such devices include micro-mechanical devices, including DMDs and other micro-electromechanical devices, and other "surface sensitive" devices. For purposes of this description, all of these devices meet the general characteristic of being "surface sensitive". Another specific example of surface sensitive devices is devices that have biological or chemical sensing means. For surface sensitive devices, the invention reduces the risk of the die being damaged during die separation, and permits wafer-level processing after wet processing and debris-forming processing have been performed.

Various techniques, other than those of the present invention, have been described for avoiding damage caused by sawing a wafer into die. These techniques are described in the following patent applications: U.S. patent application Ser. No. 08/101,122, entitled "The Use of a Saw Frame with Tape as a Substrate Carrier for Wafer Level Backend Processing"; U.S. patent application Ser. No. 08/082,183, entitled "Wafer-Like Processing After Sawing DMDs"; U.S. patent application Ser. No. 08/038,779, entitled "Grid Array Masking Tape Process"; U.S. patent application Ser. No. 08/025,533, entitled "Wafer-Like Processing After Sawing DMDs"; and U.S. patent application Ser. No. 08/001,378, entitled "Integrated Partial Sawing Process". Each of these patent applications is assigned to Texas Instruments Incorporated. Each is incorporated by reference herein.

FIG. 1 illustrates the basic steps of a method for separating a wafer into die in accordance with the invention. As an example, the wafer may be of the type used for integrated circuit device manufacturing. However, it should be understood that the wafer could be any type of material, and need not be made of semiconductor material.

It is assumed that the wafer has been at least partially fabricated. In the case of a DMD, the addressing circuitry has been fabricated in a substrate. The DMD's micro-mechanical elements have been formed, with a sacrificial layer remaining in gaps between the mirror layer and the addressing circuit layer. At least one "back-end" processing step remains to be performed. As stated above, this remaining step is a step that would be better performed after sawing but that is efficiently performed at the wafer level.

In step 11, the top surface of the wafer is coated with a protective material so that debris from subsequent inscribing will contact the coating rather than the underlying surface. The coating can be accomplished with spin-on processing, by deposition, or by growing an oxide layer. Depending on the nature of the material used for coating, the coating step may include baking. In the case of DMD fabrication, the protective coating is accomplished by first spinning-on a layer of photoresist and then depositing a thin oxide layer.

In step 12, the wafer is inscribed with separation lines, sometimes referred to as "streets", between the die on the top surface of the wafer. These separation lines define the boundaries between die and determine where the breaks between die will occur when the die are separated. The thickness of the material remaining under the separation lines depends on considerations such as the type of substrate material, further handling requirements, and the method used to break apart the die. Being thus inscribed, the wafer is sufficiently intact so as to permit subsequent processing to be performed at the wafer level.

Various inscribing techniques can be used, including mechanical scribing, laser scribing, or sawing with a rotating blade. An example of mechanical scribing is translating a diamond tip against the surface of the wafer. Objectives of inscribing are maintaining registry between die, defining breaks between die, permitting subsequent separation without damage to the die, and minimizing debris. Depending on the type of device being manufactured, one or more of these objectives may be more important than others, and this may dictate the inscribing method. For example, an advantage of blade sawing is that the thickness of the material under the streets can be easily controlled.

Typically, the inscribing is on the top surface of the wafer. This is consistent with preventing damage during a subsequent die separation step. However, on certain devices, the bottom surface could be inscribed, or the wafer could be inscribed on both surfaces.

During inscribing step 12, the wafer is mounted on a saw frame, using dicing tape. The next step, the cleaning step 13, may be performed while the wafer remains on the saw frame, as indicated in FIG. 1. However, cleaning could alternatively be done after a wafer demount, with the wafer being handled with wafer handling equipment other than a saw frame.

In step 13, the wafer is cleaned. The cleaning step removes the protective layer that was applied in step 10 and at the same time removes any particles generated by the inscribing step 12. The cleaning may be accomplished with solvents, solvent streams, or ashing. For example, the wafer can be mounted in a centrifuge and a solvent sprayed on the wafer. The centrifuge causes the solvent and dissolved coating to be spun off the wafer. As another example, if the protective coating were a resist material, removal could be by means of a wet etch.

In step 14, if the wafer has been cleaned while still on the saw frame, it is now demounted for wafer-level processing. Demounting is performed so as to permit the use of wafer handling tools. If a UV sensitive tape is used, it can be removed by weakening the adhesion by exposure to UV radiation. Conventional wafer handling tools may be used, to the extent that they do not cause the wafer to prematurely break. In its inscribed state, the wafer is intact as a wafer, but is less sturdy than if it were not inscribed.

In step 15, the wafer is processed with one or more wafer-level processes. Examples of processing steps for a DMD device is explained below in connection with FIGS. 2 and 3. For many types of wafers, the processing of step 15 will include removal of a sacrificial layer. For micro-mechanical devices, the wafer-level processing could be passivation, which prevents or cures sticking between contacting surfaces, as described below in connection with FIG. 2. For any type of device, another type of processing that could be performed in step 15 is testing. Because the wafer is still intact, die alignment is maintained. This facilitates testing, as well as any remaining lithography to be done. Typically, the wafer-level processing of step 15 includes all processing for completing the die fabrication other than packaging.

In step 16, the wafer is remounted on a saw frame with mounting tape in preparation for die separation. The mounting tape may be UV sensitive, which aids during later removal of the die from the tape.

In step 17, the wafer is separated into die along the separation lines inscribed in step 12. Typically, this step is performed by applying pressure to break the wafer. Various breaking techniques are possible.

One method of breaking involves holding the wafer upside down mounted on its frame with mounting tape. The wafer is then bowed about a suitable radius of curvature to break the wafer and separate the die along the separation lines. Some particles formed by the breaking stick to the mounting tape. Others fall downward. A flow of ionized inert gas may be maintained in such a way as to discourage reattachment of any of the particles to the die because of electrostatic charging.

Another method of breaking involves using wedges to provide stress concentration points along the separation lines. This technique is described in U.S. patent application Ser. No. 08/001,378, incorporated by reference above.

As part of the die separation step 17, it may be desirable to expand the separated die. This may be accomplished by transferring mounting tape, with the separated die still attached, to a smaller saw frame. The tape is pushed against the smaller frame, which fits inside the perimeter of the larger frame. During this procedure, the tape is stretched so that the die are farther apart. This prevents edge-to-edge contact between die and reduces particle contamination.

In step 18, the die are picked up for packaging. Step 18 may be performed with conventional pick-and-place equipment. For die having fragile surface elements, a special vacuum collet may be used that minimizes damage from airflow. This collet is described in U.S. patent application Ser. No. 08/346,957, entitled "Baffled Collet for Vacuum Pick-up of a Semiconductor Die", assigned to Texas Instruments Incorporated and incorporated herein by reference. If the wafer is mounted on a UV sensitive tape, the wafer is exposed to UV radiation to weaken the tape's adhesion.

Figure 2:
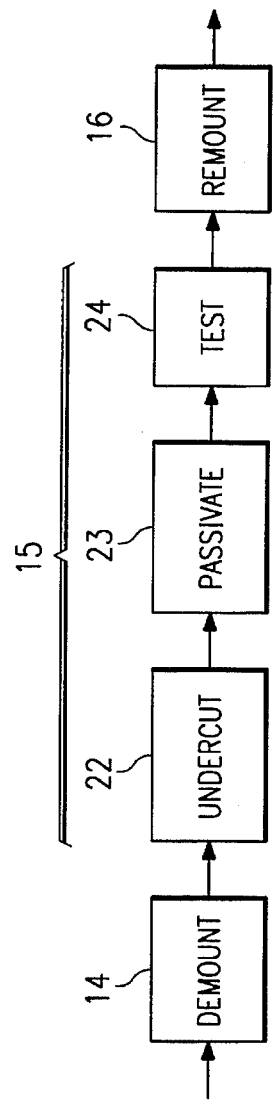
FIG. 2 illustrates post-inscription wafer-level processing steps for a digital micro-mirror device, where cleaning is performed prior to demount from the saw frame.

FIG. 2 illustrates one alternative for the wafer-level processing of step 15, performed during manufacture of a DMD. As indicated, the demounting step 14 occurs after cleaning as in the general method of FIG. 1.

In step 22, the sacrificial layer is removed, thereby providing freedom of motion to the mirrors and hinges. One method of performing step 22 is with a plasma etch.

In step 23, the die are passivated. In general, this passivation step 23 is any wafer-level step performed to unstick any mirrors that are stuck in a tilted position, or to reduce the likelihood that the mirrors will stick. Various passivation techniques are possible, such as application of lubricative coatings, drying, and cleaning. Many passivation methods are directed to reducing the surface energy of any contacting surfaces, such as the underside of the mirrors and their landing points. Examples of wafer-level passivation process are described in U.S. patent application Ser. No. 08/239,497, entitled "PFPE Coatings for Micromechanical Devices", and in U.S. patent application Ser. No. 5,331,454, entitled "Low Reset Voltage Process for DMD", each assigned to Texas Instruments Incorporated, and each incorporated herein by reference.

In step 24, the die are tested. Because the die registration has been maintained, the test equipment can be registered once to the wafer, which includes making any electrical contacts and any alignments necessary for testing. Then, each die can be tested by stepping from die to die, without the need to register the test equipment to each die.

After step 24, the die are remounted, as described above in connection with FIG. 1.

Figure 3:
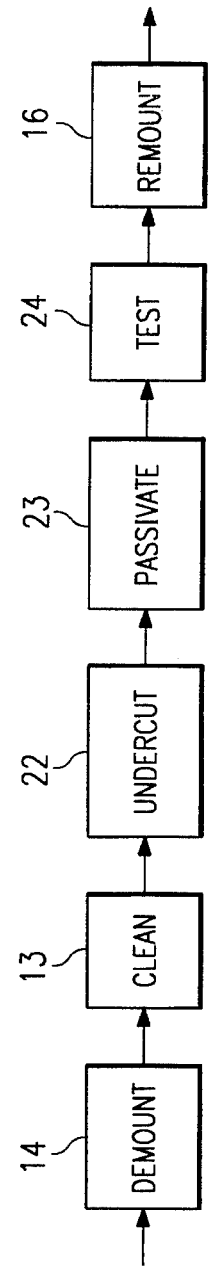
FIG. 3 illustrates alternative post-inscription wafer-level processing steps for a digital micro-mirror device, where cleaning is performed after demount from the saw frame.

FIG. 3 illustrates an alternative sequence of steps for DMD manufacture. The coating step 11 and inscription step 12 are performed as described above. However, instead of cleaning the wafer while mounted on a saw frame, the wafer is demounted prior to cleaning. The subsequent steps are the same as described above in connection with FIG. 2.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of separating a wafer into die, comprising the steps of:

covering the top surface of said wafer with a protective coating;

inscribing separation lines on said wafer, said separation lines representing boundaries between die;

removing said protective coating;

processing said wafer with at least one wafer-level process; and separating said wafer into die along said separation lines.

2. The method of claim 1, wherein said covering step is performed with a deposited layer.

3. The method of claim 1, wherein said covering step is performed with a spun-on layer.

4. The method of claim 1, wherein said inscribing step is performed with a mechanical scribe.

5. The method of claim 1, wherein said inscribing step is performed with a laser scribe.

6. The method of claim 1, wherein said inscribing step is performed with a saw.

7. The method of claim 1, wherein said removing step is performed while said wafer is mounted on a saw frame used to hold said wafer during said inscribing step.

8. The method of claim 1, wherein said removing step is performed after said wafer has been demounted from a saw frame used to hold said wafer during said inscribing step.

9. The method of claim 1, wherein said die are those of micro-mechanical devices and wherein said processing step is performed by removing a sacrificial layer.

10. The method of claim 1, wherein said die are those of micro-mechanical devices and wherein said processing step is performed by passivating contacting surfaces.

11. The method of claim 1, wherein said processing step is performed by wafer level testing.

12. The method of claim 1, wherein said separating step is performed by breaking said wafers apart along said separation lines.

13. The method of claim 12, wherein said breaking is performed by placing said wafer on a curved surface.

14. A method of separating a wafer, used for manufacturing micromechanical devices, into die, comprising the steps of:

covering the top surface of said wafer with a protective coating, said die having at least one sacrificial layer under micro-mechanical elements of said die;

inscribing separation lines on said wafer, said separation lines representing boundaries between die;

removing said protective coating;

removing said sacrificial layer using a wafer-level process; and separating said wafer into die along said separation lines.

15. The method of claim 14, wherein said inscribing step is performed with a mechanical scribe.

16. The method of claim 14, wherein said inscribing step is performed with a laser scribe.

17. The method of claim 1, wherein said inscribing step is performed with a saw.

18. The method of claim 1, wherein said processing step is performed by passivating contacting surfaces.

19. The method of claim 1, wherein said processing step is performed by wafer level testing.

20. A method of separating a wafer, used for manufacturing digital micro-mirror devices, into die, comprising the steps of:

covering the top surface of said wafer with a protective coating, said die having at least one sacrificial layer under mirror elements of said die;

inscribing separation lines on said wafer, said separation lines representing boundaries between die;

removing said protective coating;

removing said sacrificial layer using a wafer-level process;

testing said die by stepping from die-to-die as registered on said wafer; and separating said wafer into die along said separation lines.

* * * * *